(12) United States Patent
An

(10) Patent No.: US 11,197,380 B2
(45) Date of Patent: Dec. 7, 2021

(54) FLEXIBLE DISPLAY AND ELECTRONIC DEVICE INCLUDING THE SAME

(71) Applicant: SAMSUNG ELECTRONICS CO., LTD., Suwon-si (KR)

(72) Inventor: Jungchul An, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 40 days.

(21) Appl. No.: 16/716,093

(22) Filed: Dec. 16, 2019

(65) Prior Publication Data

US 2020/0221587 A1 Jul. 9, 2020

(30) Foreign Application Priority Data

Jan. 9, 2019 (KR) .................. 10-2019-0002766

(51) Int. Cl.
*H05K 5/00* (2006.01)
*H05K 5/02* (2006.01)
*H05K 5/03* (2006.01)

(52) U.S. Cl.
CPC ......... *H05K 5/0017* (2013.01); *H05K 5/0217* (2013.01); *H05K 5/03* (2013.01)

(58) Field of Classification Search
CPC ...... H05K 5/0017; H05K 5/03; H05K 5/0217; G06F 1/3265; G06F 1/1652; G09F 9/301
See application file for complete search history.

(56) References Cited

U.S. PATENT DOCUMENTS

| 9,419,065 | B2* | 8/2016 | Degner ................. H05K 1/028 |
| 9,614,168 | B2 | 4/2017 | Zhang et al. |
| 9,766,737 | B2* | 9/2017 | Ahn ..................... H01L 27/3262 |
| 10,539,978 | B2 | 1/2020 | Lee et al. |
| 10,727,435 | B2* | 7/2020 | Kim ..................... G06F 1/1601 |
| 2013/0002569 | A1* | 1/2013 | Kang ................... G06F 3/0445 345/173 |

(Continued)

FOREIGN PATENT DOCUMENTS

| KR | 10-2017-0024204 | 3/2017 |
| KR | 10-2017-9030023 | 3/2017 |

(Continued)

OTHER PUBLICATIONS

International Search Report dated Mar. 20, 2020 in counterpart International Patent Application No. PCT/KR2019/017475.

*Primary Examiner* — Rockshana D Chowdhury
(74) *Attorney, Agent, or Firm* — Nixon & Vanderhye P.C.

(57) ABSTRACT

An electronic device includes a foldable housing and a flexible display. The foldable housing includes a first housing, a second housing foldably connected to the first housing, and a recess provided in both the first housing and the second housing. The first housing and the second housing are foldable about a first axis extending in a first direction, face each other in a folded state, and together define a plane in an unfolded state. The flexible display is disposed in the recess and includes a first area corresponding to the first housing and a second area corresponding to the second housing. The flexible display includes a plurality of layers, at least one of which includes a flat portion and a bent portion extending from an edge of the flat portion. The bent portion is bent about a second axis parallel to the first axis.

20 Claims, 14 Drawing Sheets

(56) References Cited

U.S. PATENT DOCUMENTS

| | | | |
|---|---|---|---|
| 2016/0041679 A1* | 2/2016 | Ahn | H01L 51/0097 |
| | | | 345/173 |
| 2016/0172428 A1 | 6/2016 | Song et al. | |
| 2017/0064879 A1 | 3/2017 | Lee et al. | |
| 2017/0170255 A1 | 6/2017 | Ha et al. | |
| 2018/0053451 A1* | 2/2018 | Han | G09F 9/301 |
| 2018/0149785 A1* | 5/2018 | Lee | G02F 1/13363 |
| 2018/0149786 A1 | 5/2018 | Lee et al. | |
| 2018/0181165 A1* | 6/2018 | Park | G06F 1/1652 |
| 2018/0246603 A1* | 8/2018 | Yu | G06F 3/047 |
| 2018/0341358 A1* | 11/2018 | Ahn | G06F 1/16 |
| 2018/0375043 A1* | 12/2018 | Jung | B32B 15/08 |
| 2019/0006620 A1* | 1/2019 | Kim | B32B 27/08 |
| 2019/0036068 A1 | 1/2019 | Kim et al. | |

FOREIGN PATENT DOCUMENTS

| | | |
|---|---|---|
| KR | 10-2017-0071659 | 6/2017 |
| KR | 10-2017-0094266 | 8/2017 |
| KR | 10-1834793 | 3/2018 |

\* cited by examiner

FLEXIBLE DISPLAY AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2019-0002766, filed on Jan. 9, 2019, in the Korean Intellectual Property Office, the disclosure of which is incorporated by reference herein in its entirety.

BACKGROUND

Field

The disclosure relates to a flexible display capable of preventing and/or reducing irregular deformation in a bending or folding operation and to an electronic device including the flexible display.

Description of Related Art

With the growth of related technologies, various forms of a display equipped in a great variety of electronic devices are being developed. For example, a display resolution is increasing to provide a higher picture quality, a display thickness is becoming thinner, and power consumption of the display is being reduced. In addition, a flexible display that allows a change in shape in response to a user's manipulation has been introduced and is being developed.

In a bending or folding operation of an electronic device equipped with a flexible display, a window layer of the flexible display may be irregularly deformed. In case of a conventional flexible display, the window layer is formed larger than the other layers such as a polarizing plate layer and a display panel, thus causing a non-adhered portion between layers. Further, in this portion, the distribution of shear stresses between the layers may be uneven, and therefore the irregular deformation of the window layer may be caused.

Accordingly, there is a need for a flexible display capable of preventing and/or reducing the irregular deformation of the window layer.

SUMMARY

Embodiments of the disclosure provide a flexible display in which a window layer has the same or similar size as that of other layers, such as a polarizing plate layer and a display panel, and thereby a portion causing irregular deformation may be removed. For example, when the flexible display is bent or folded, the layers of the flexible display coincide with each other at edges that intersect the central axis of the bending or folding operation.

According to various example embodiments of the disclosure, an electronic device may include an electronic device that includes a foldable housing; and a flexible display, wherein the foldable housing includes a first housing; a second housing foldably connected to the first housing; and a recess provided in both the first housing and the second housing, wherein the first housing and the second housing are foldable about a first axis extending in a first direction, face each other in a folded state, and together define a plane in an unfolded state, wherein the flexible display is disposed in the recess and includes a first area corresponding to the first housing and a second area corresponding to the second housing, wherein the flexible display includes a plurality of layers, at least one of the plurality of layers including a flat portion and a bent portion extending from an edge of the flat portion, and wherein the bent portion is bent about a second axis parallel to the first axis.

According to various example embodiments of the disclosure, a flexible display may include a window layer capable of being subjected to a bending deformation; a first axis parallel to a surface of the window layer, crossing the window layer, and being a center line of the bending deformation of the window layer; a polarizing plate layer having one surface combined with another surface of the window layer wherein edges of the polarizing plate layer coincide with corresponding edges of the window layer with respect to a direction of the first axis; a display panel having one surface combined with another surface of the polarizing plate layer wherein edges of the one surface of the display panel coincide with corresponding edges of the polarizing plate layer with respect to the direction of the first axis; and a plate layer having one surface combined with another surface of the display panel.

According to various example embodiments of the disclosure, an electronic device may include a first housing; a second housing foldably connected to the first housing; a recess provided in both the first housing and the second housing from one surface of the electronic device towards other surface; and a flexible display disposed in the recess, wherein the flexible display includes a window layer having one exposed surface and configured to be folded together with the first housing and the second housing; a first axis parallel to the surface of the window layer crossing the window layer, and being a center line of the bending deformation of the window layer; a polarizing plate layer having one surface combined with another surface of the window layer and wherein edges of the polarizing plate coincide with corresponding edges of the window layer with respect to a direction of the first axis; a display panel having one surface combined with another surface of the polarizing plate layer wherein edges of the display panel coincide with corresponding edges of the polarizing plate layer with respect to the direction of the first axis; and a plate layer having one surface combined with another surface of the display panel.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Hereinafter, various example embodiments of the disclosure will be described in greater detail with reference to accompanying drawings.

Figure 1:
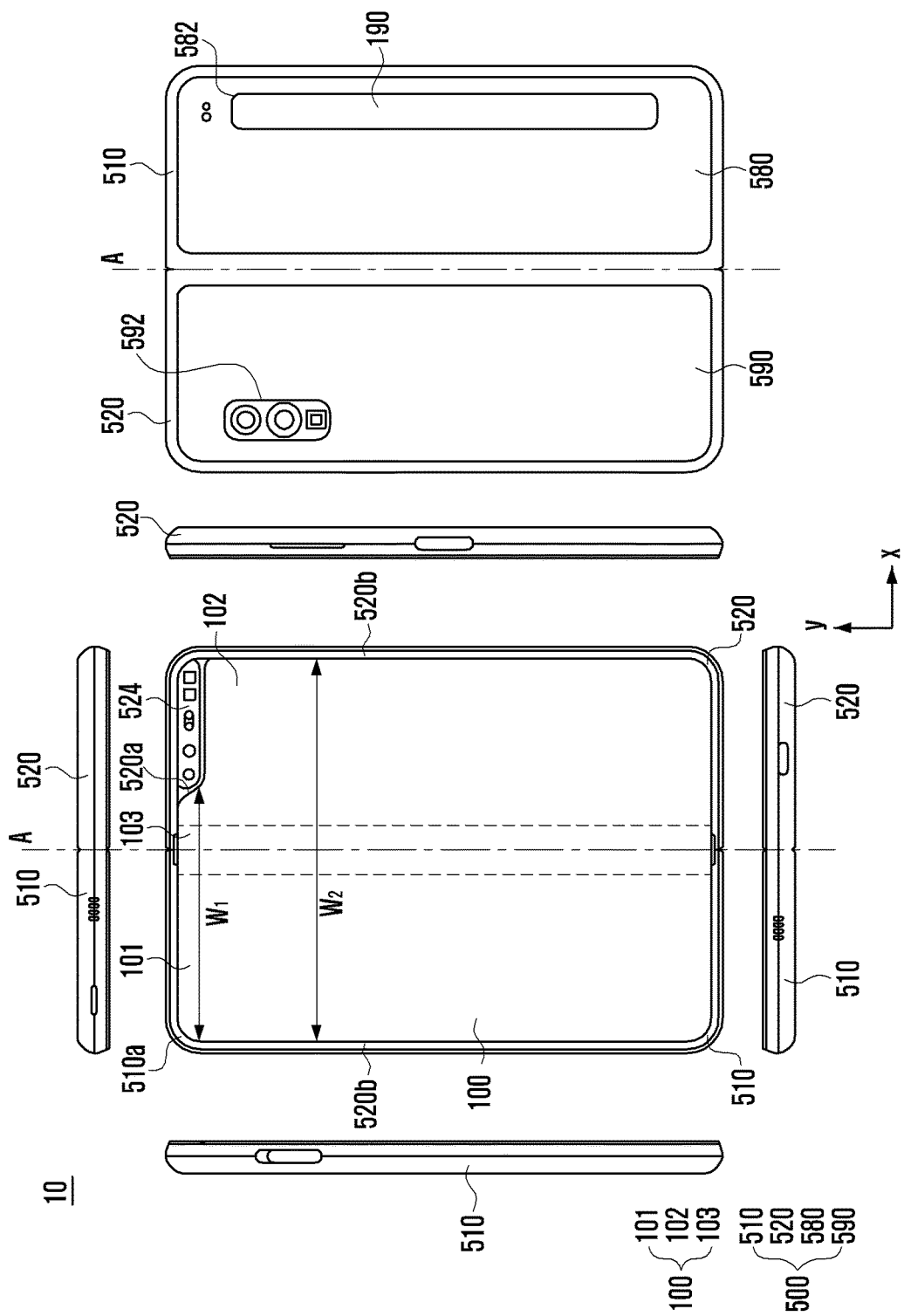
FIG. 1 is a diagram illustrating an example foldable electronic device in a flat state according to an embodiment.
Figure 2:
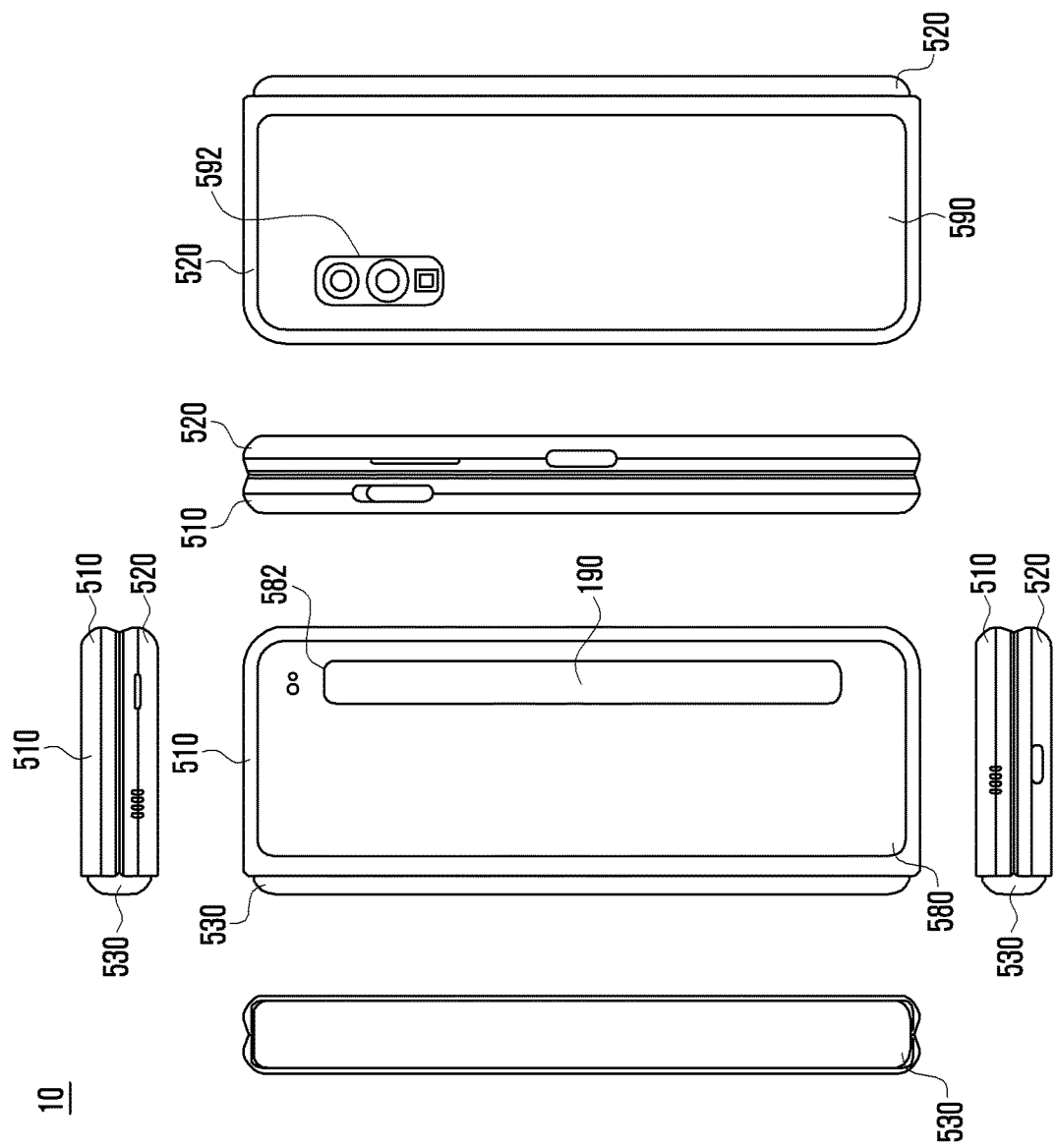
FIG. 2 is a diagram illustrating an example foldable electronic device in a folded state according to an embodiment.

FIG. 1 is a diagram illustrating an example foldable electronic device in a flat state according to an embodiment. FIG. 2 is a diagram illustrating an example foldable electronic device in a folded state according to an embodiment.

Referring to FIGS. 1 and 2, in an embodiment, the electronic device 10 may include a foldable housing 500, a hinge cover 530 that covers a foldable portion of the foldable housing 500, and a flexible or foldable display 100 (which may hereinafter, be referred to as "display") disposed in a space defined by the foldable housing 500. In the disclosure, a surface on which the display 100 is disposed may, for example, be referred to as a first surface or a front surface of the electronic device 10. In addition, the opposite surface of the front surface may, for example, be referred to as a second surface or a rear surface of the electronic device 10. Also, a surface surrounding a space between the front and rear surfaces may, for example, be referred to as a third surface or a lateral surface of the electronic device 10.

In an embodiment, the foldable housing 500 may include a first housing structure (e.g., a first housing) 510, a second housing structure (e.g., a second housing) 520 having a sensor area 524, a first rear cover 580, and a second rear cover 590. The foldable housing 500 of the electronic device 10 is not limited to the shape and configuration shown in FIGS. 1 and 2, and may be implemented with any other shape and configuration. For example, and without limitation, in another embodiment, the first housing 510 and the first rear cover 580 may be integrally formed, and also the second housing 520 and the second rear cover 590 may be integrally formed.

In the illustrated embodiment, the first housing 510 and the second housing 520 are disposed at both sides with respect to a folding axis (indicated by 'A'), and may have a generally symmetric shape with respect to the folding axis (A). As will be described in greater detail below, the first and second housings 510 and 520 may have different angles or distances therebetween, depending on whether the electronic device 10 is in a flat (e.g., unfolded) state, a folded state, or an intermediate state. In the illustrated embodiment, the second housing 520 has the sensor area 524 in which various sensors are disposed. Excepting the provision of the sensor area 524, both housings may be substantially symmetrical in shape.

In an embodiment, as shown in FIG. 1, the first housing 510 and the second housing 520 may together include a recess for accommodating the display 100 therein. In the illustrated embodiment, the recess may have two or more different widths in a direction perpendicular to the folding axis (A) because of the sensor area 524.

For example, the recess may have a first width ($W_1$) between a first portion 510a of the first housing 510 parallel to the folding axis (A) and a first portion 520a of the second housing 520 formed at one edge of the sensor area 524, and a second width ($W_2$) between a second portion 510b of the first housing 510 parallel to the folding axis (A) and a second portion 520b of the second housing 520 not corresponding to the sensor area 524 and being parallel to the folding axis (A). In this example, the second width ($W_2$) may be greater than the first width ($W_1$). In other words, the first portion 510a of the first housing 510 and the first portion 520a of the second housing 520, which have asymmetrical shapes, define the first width ($W_1$) of the recess, whereas the second portion 510b of the first housing 510 and the second portion 520b of the second housing 520, which have symmetrical shapes, define the second width ($W_2$) of the recess. In an embodiment, the first portion 520a and the second portion 520b of the second housing 520 may have different distances from the folding axis (A). The width of the recess is not limited to the illustrated example. In various embodiments, the recess may have a plurality of different widths depending on the shape of the sensor area 524 or asymmetrical shapes of the first and second housings 510 and 520.

In an embodiment, at least a portion of the first and second housings 510 and 520 may comprise a metallic or non-metallic material having a selected rigidity value to support the display 100.

In an embodiment, the sensor area 524 may occupy a certain region adjacent to one corner of the second housing 520. The arrangement, shape, and size of the sensor area 524 are not limited to the illustrated example. For example, in other embodiments, the sensor area 524 may be disposed at any other corner of the second housing 520 or at any position between top and bottom corners. In an embodiment, components for performing various functions may be embedded in the electronic device 10 and exposed to the front surface of the electronic device 10 through the sensor area 524 or through one or more openings provided in the sensor area 524. In various embodiments, such components may include various types of sensors, which may include, for example, and without limitation, at least one of a front camera, a receiver, a proximity sensor, or the like.

The first rear cover 580 is disposed on one side of the folding axis on the rear surface of the electronic device 10. The first rear cover 580 may have, for example, a substantially rectangular periphery surrounded by the first housing 510. Similarly, the second rear cover 590 is disposed on the other side of the folding axis on the rear surface of the electronic device 10, and a substantially rectangular periphery thereof may be surrounded by the second housing 520.

In the illustrated embodiment, the first rear cover 580 and the second rear cover 590 may have a substantially symmetrical shape with respect to the folding axis (A). This is, however, not essential. In another embodiment, the electronic device 10 may include the first and second rear covers 580 and 590 having various shapes. In still another embodiment, the first rear cover 580 may be integrally formed with the first housing 510, and the second rear cover 590 may be integrally formed with the second housing 520.

In an embodiment, the first rear cover 580, the second rear cover 590, the first housing 510, and the second housing 520 may together define a space in which various components of the electronic device 10 (e.g., a printed circuit board or a battery) are disposed. In an embodiment, one or more components may be disposed near and visually exposed to the rear surface of the electronic device 10. For example, at least a portion of a sub display 190 may be visually exposed through a first rear area 582 of the first rear cover 580. In another embodiment, one or more components or sensors may be visually exposed through a second rear area 592 of the second rear cover 590. In various embodiments, such sensors may include, for example, and without limitation, a proximity sensor and/or a rear camera, or the like.

Referring to FIG. 2, the hinge cover 530 is disposed between the first housing 510 and the second housing 520 and may be configured to cover an internal component (e.g., a hinge). In an embodiment, depending whether the electronic device 10 is in a flat state or in a folded state, the hinge cover 530 may be hidden by a part of the first and second housings 510 and 520 or exposed to the outside.

For example, when the electronic device 10 is in the flat state as shown in FIG. 1, the hinge cover 530 may be hidden by the first and second housings 510 and 520, thus being not exposed. Also, when the electronic device 10 is in the folded state (e.g., a fully folded state) as shown in FIG. 2, the hinge cover 530 may be exposed to the outside between the first and second housings 510 and 520. In the case of an intermediate state in which the first and second housings 510 and 520 are folded at a certain angle, the hinge cover 530 may be partially exposed to the outside between the first and second housings 510 and 520. The exposed area in the intermediate state may be smaller than that in the fully folded state. In an embodiment, the hinge cover 530 may have a curved surface.

The display 100 may be disposed in the space defined by the foldable housing 500. For example, the display 100 may be mounted in the recess formed by the foldable housing 500 while forming most of the front surface of the electronic device 10.

Therefore, the front surface of the electronic device 10 may include the display 100, a portion of the first housing 510 adjacent to the display 100, and a portion of the second housing 520. In addition, the rear surface of the electronic device 10 may include the first rear cover 580, a portion of the first housing 510 adjacent to the first rear cover 580, the second rear cover 590, and a portion of the second housing 520 adjacent to the second rear cover 590.

The display 100 may refer to a display that allows at least a portion thereof to be deformed into a curved surface. In an embodiment, as shown in FIG. 1, the display 100 may include a folding area 103, a first area 101 disposed on one side with respect to the folding area 103 (e.g., the left side of the folding area 103 shown in FIG. 1), and a second area 102 disposed on the other side with respect to the folding area 103 (e.g., the right side of the folding region 103 shown in FIG. 1).

The divided areas of the display 100 illustrated in FIG. 1 is an example only, and the display 100 may be divided into a plurality of areas (e.g., two, four or more) according to the structure or function thereof. For example, unlike being divided into areas based on the folding area 103 or the folding axis (A) each parallel to the y-axis in the illustrated FIG. 1 embodiment, the display 100 in another embodiment may be divided into areas based on another folding area or folding axis (e.g., each parallel to the x-axis).

The first area 101 and the second area 102 may have a symmetrical shape as a whole with respect to the folding area 103. However, unlike the first area 101, the second area 102 may have a cut portion to expose the sensor area 524, resulting in an asymmetrical shape. Therefore, the first and second areas 101 and 102 may have a symmetrical portion and an asymmetrical portion.

Hereinafter, in each particular state of the electronic device 10, the operations of the first and second housings 510 and 520 and the respective areas of the display 100 will be described.

In an embodiment, when the electronic device 10 is in a flat state (e.g., FIG. 1), the first housing 510 and the second housing 520 are disposed to form an angle of 180 degrees and face the same direction. Thus, the surfaces of the first and second areas 101 and 102 of the display 100 form an angle of 180 degrees with each other and face the same direction (e.g., the front direction of the electronic device). In addition, the folding area 103 may form the same plane as the first and second areas 101 and 102.

In an embodiment, when the electronic device 10 is in a folded state (e.g., FIG. 2), the first housing 510 and the second housing 520 are disposed to face each other. Thus, the surfaces of the first and second areas 101 and 102 of the display 100 form a small angle (e.g., between 0 and 10 degrees) and face each other. In addition, the folding area 103 may be formed to have partially a curved surface having a certain curvature.

In an embodiment, when the electronic device 10 is in an intermediate state, the first housing 510 and the second housing 520 are disposed to form a certain angle. Thus, the surfaces of the first and second areas 101 and 102 of the display 100 form a certain angle which is greater than the angle in the folded state and smaller than the angle in the flat state. In addition, the folding area 103 may be formed to have partially a curved surface having a certain curvature. This curvature is smaller than the curvature in the folded state.

Figure 3:
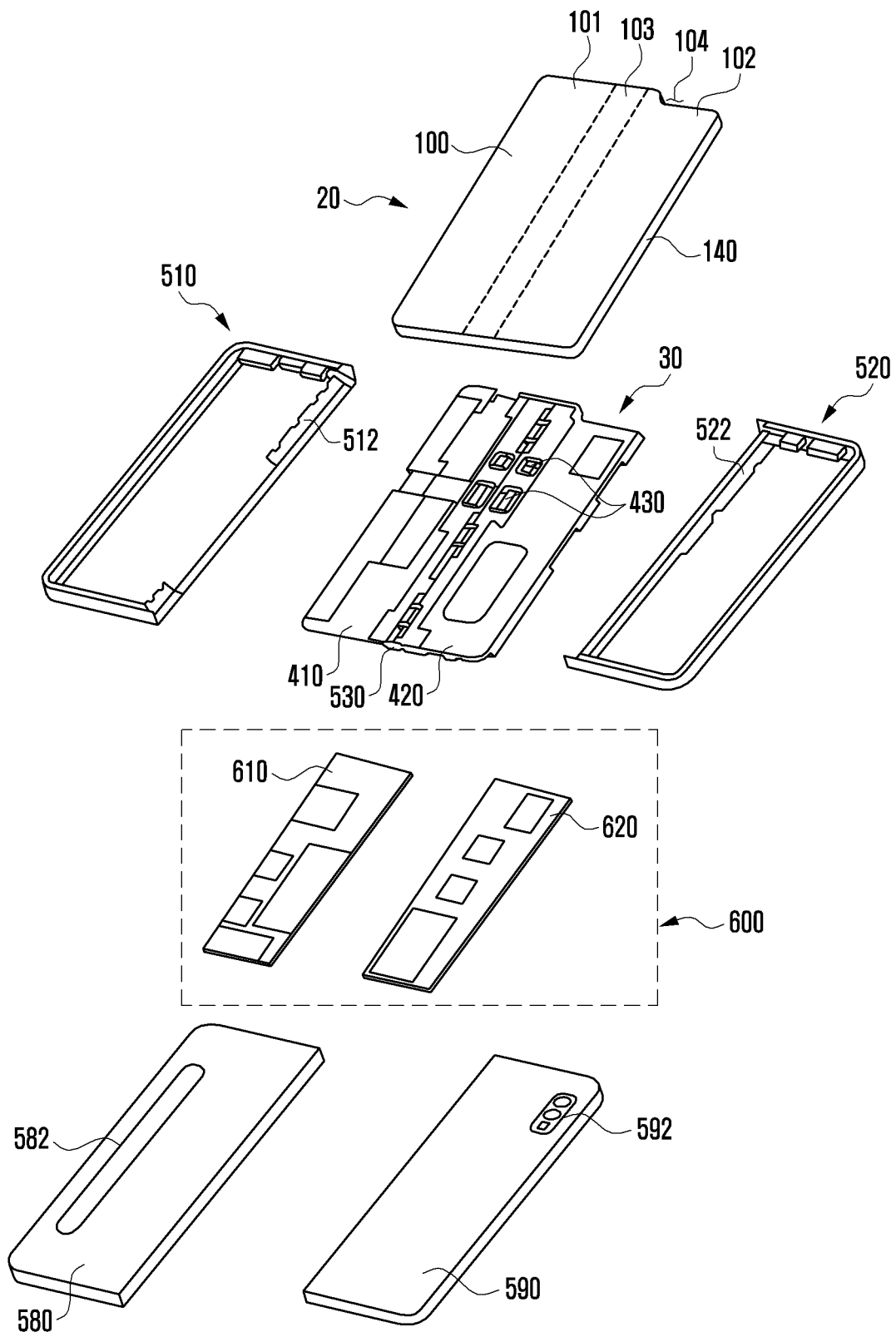
FIG. 3 is an exploded perspective view illustrating an example foldable electronic device according to an embodiment.

FIG. 3 is an exploded perspective view illustrating an example foldable electronic device according to an embodiment.

Referring to FIG. 3, in an embodiment, the electronic device 10 may include a display unit (e.g., including a display) 20, a bracket assembly (e.g., including a bracket) 30, a substrate unit (e.g., including a substrate) 600, the first housing 510, the second housing 520, the first rear cover 580, and the second rear cover 590. In the disclosure, the display unit 20 may be also referred to as a display module or a display assembly.

The display unit 20 may include the display 100 and at least one plate or layer 140 on which the display 100 is mounted. In an embodiment, the plate 140 may be disposed between the display 100 and the bracket assembly 30. The display 100 may be disposed on at least a portion of one surface (e.g., the upper surface in FIG. 3) of the plate 140. The plate 140 may have a shape corresponding to the display 100. For example, a portion of the plate 140 may have a shape corresponding to a cut portion 104 of the display 100.

The bracket assembly 30 may include a first bracket 410, a second bracket 420, a hinge structure (e.g., including a hinge) disposed between the first and second brackets 410 and 420, the hinge cover 530 covering the hinge structure, and a wiring member 430 (e.g., a flexible printed circuit (FPC)) intersecting with the first and second brackets 410 and 420.

In an embodiment, the bracket assembly 30 may be disposed between the plate 140 and the substrate unit 600. For example, the first bracket 410 may be disposed between the first area 101 of the display 100 and a first substrate 610 of the substrate unit 600. The second bracket 420 may be disposed between the second area 102 of the display 100 and a second substrate 620 of the substrate unit 600.

In an embodiment, the wiring member 430 and the hinge structure may be disposed, at least in part, inside the bracket assembly 30. The wiring member 430 may be disposed in a direction (e.g., the x-axis direction) that crosses the first and second brackets 410 and 420. The wiring member 430 may be disposed in a direction perpendicular to a folding axis (e.g., the y-axis or the folding axis (A) in FIG. 1) of the folding area 103 of the electronic device 10.

As mentioned above, the substrate unit 600 may include the first substrate 610 disposed to correspond to the first bracket 410, and the second substrate 620 disposed to correspond to the second bracket 420. The first and second substrates 610 and 620 may be disposed in a space formed by all or substantially all of the bracket assembly 30, the first housing 510, the second housing 520, the first rear cover 580, and the second rear cover 590. On the first substrate 610 and the second substrate 620, electronic components for implementing various functions of the electronic device 10 may be mounted.

The first housing 510 and the second housing 520 may be assembled to be combined with both sides of the bracket assembly 30 in a state where the display unit 20 is combined with the bracket assembly 30. As will be described below, the first housing 510 and the second housing 520 may be combined with the bracket assembly 30 by sliding on both sides of the bracket assembly 30.

In an embodiment, the first housing 510 may have a first rotation supporting surface 512, and the second housing 520 may have a second rotation supporting surface 522 corresponding to the first rotation supporting surface 512. Each of the first and second rotation supporting surfaces 512 and 522 may have a curved surface corresponding to the curved surface included in the hinge cover 530.

In an embodiment, when the electronic device 10 is in the flat state (e.g., FIG. 1), the first and second rotation supporting surfaces 512 and 522 cover the hinge cover 530 so that the hinge cover 530 may not be exposed or be exposed in a relatively small amount to the rear surface of the electronic device 10. Meanwhile, when the electronic device 10 is in the folded state (e.g., FIG. 2), the first and second rotation supporting surfaces 512 and 522 rotate along the curved surfaces included in the hinge cover 530 so that the hinge cover 530 may be exposed to the rear surface of the electronic device 10.

Figure 4A:
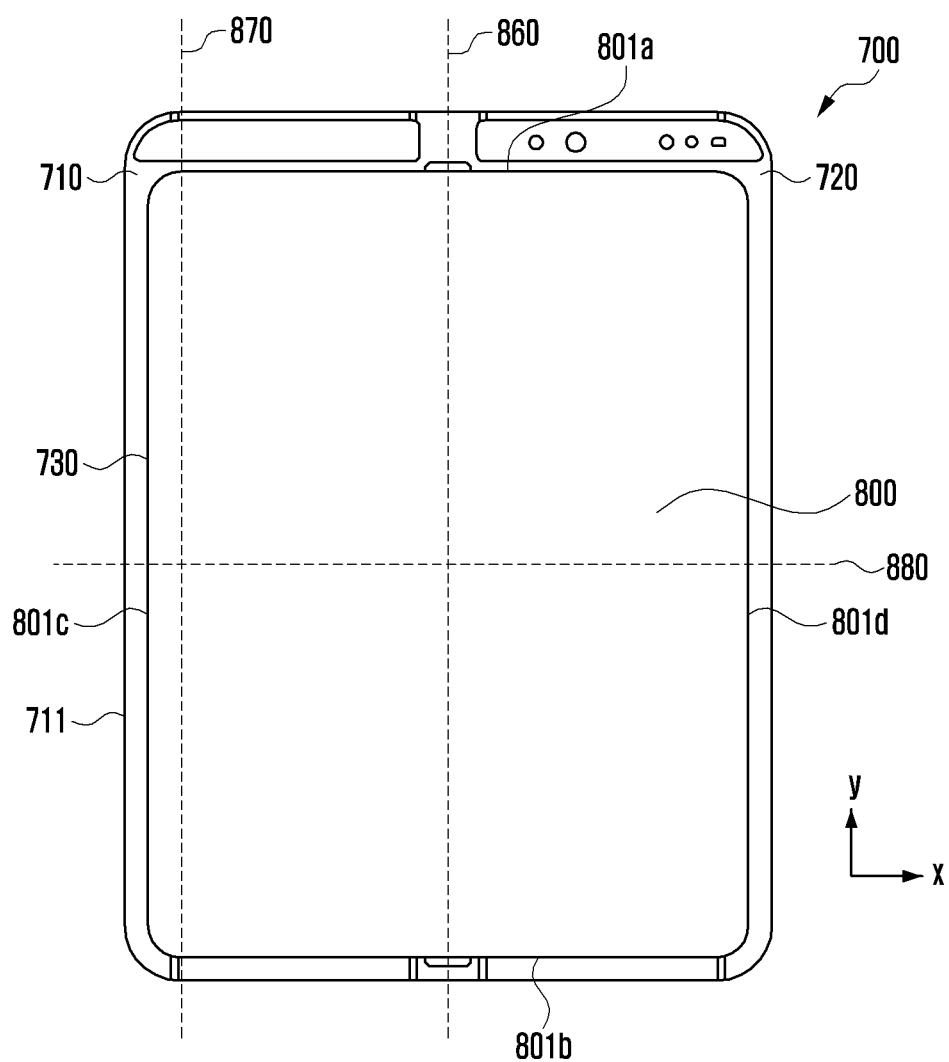
FIGS. 4A, 4B and 4C are diagrams illustrating an example foldable electronic device according to an embodiment.
Figure 4B:
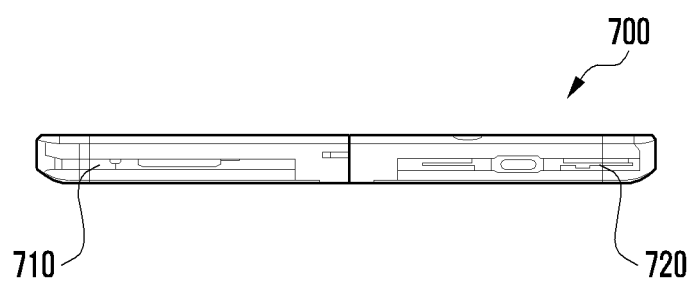
Figure 4C:
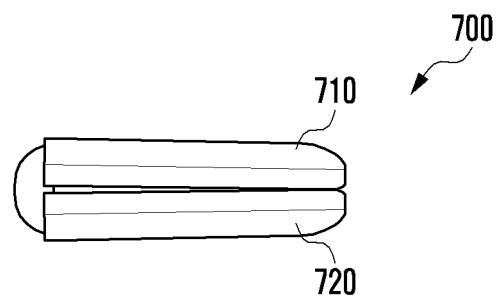

FIGS. 4A, 4B and 4C are diagrams illustrating an example foldable electronic device 700 according to an embodiment.

FIG. 4A is a diagram illustrating one surface of the electronic device 700 according to an embodiment.

In describing the electronic device 700 or a flexible display 800 according to an embodiment, the surface shown in FIG. 4A will be referred to as one surface, and the opposite surface will be referred to as the other surface. For example, one surface as shown in FIG. 4A may refer, for example, to a front surface of the electronic device 700, and the other surface may refer, for example, to a rear surface of the electronic device 700. In describing various layers of the flexible display 800, a surface facing the front surface of the electronic device 700 may be referred to as one surface, and a surface opposite to one surface may be referred to as the other surface.

In addition, the term 'folding' may be used in describing the electronic device 700, and the term 'bending deformation' may be used in describing the flexible display 800. These terms may be interpreted as having the same or similar meaning. For example, even though the electronic device 700 will be described as to a case of folding, this description may also be applied to a case of bending deformation including bending or rolling.

The electronic device 700 according to an embodiment may include a first housing 710, a second housing 720, a recess 730, and the flexible display 800.

In an embodiment, the first housing 710 and the second housing 720 may be combined with each other while allowing a folding operation. The first housing 710 and the second housing 720 may be folded with respect to a first axis 860. The first housing 710 and the second housing 720 may be disposed at both sides of the first axis 860 to be substantially symmetrical with respect to the first axis 860.

In an embodiment, the first axis 860 may be positioned between the first housing 710 and the second housing 720 while crossing the electronic device 700 lengthwise. The first axis 860 may cross first and second opposite edges 801a and 801b of the flexible display 800 which is substantially rectangular in shape. As shown in FIG. 4A, the first axis 860 may have the same direction as that of the y-axis, and the first axis 860 may divide the electronic device 700 into two parts along the y-axis direction.

In an embodiment, a second axis 870 may be parallel to the first axis 860 and biased towards one of the first and second housings 710 and 720. The second axis 870 may provide a center of curvature of a bent portion 831 (see, e.g., FIG. 6) extended from a display panel 830 included in the flexible display 800, which will be described in greater detail below with reference to FIG. 6.

In an embodiment, a third axis 880 may be perpendicular to the first axis 860 while crossing the electronic device 700 widthwise. The third axis 880 may cross third and fourth opposite edges 801c and 801d of the flexible display 800 which is substantially rectangular in shape while the first axis 860 crosses the first and second opposite edges 801a and 801b as described above. As shown in FIG. 4A, the third axis 880 may have the same direction as that of the x-axis direction.

In an embodiment, the recess 730 may be provided throughout the first and second housings 710 and 720. In the recess 730, the flexible display 800 may be disposed.

The first housing 710 may further include a first lateral member 711 forming a part of the recess 730 and having a first portion extending in parallel to the first axis 860, and the bent portion 831 extends along the first portion of the first lateral member 711 when the flexible display 800 is viewed from above.

FIG. 4B is a diagram illustrating an unfolded (e.g., flat) state of the electronic device 700 according to an embodiment, and FIG. 4C is a diagram illustrating a folded state of the electronic device 700 according to an embodiment.

When the electronic device 700 is in the unfolded state as shown in FIG. 4B, the first housing 710 and the second housing 720 may be arranged side by side in the unfolded state so that one surface thereof may form a plane together.

When the electronic device 700 is in the folded state as shown in FIG. 4C, the first housing 710 and the second housing 720 may face each other at one surface thereof. In addition, a certain structure such as the hinge cover (530 in FIG. 2) may be disposed so that internal structures including the flexible display are not directly exposed between the first and second housings 710 and 720 when the electronic device 700 is folded.

The described embodiment relates to case of in-folding in which the electronic device 700 is folded with respect to the first axis 860 of the y-axis direction so that the flexible display is folded and thus faces each other. This is, however, an example only. In another embodiment, case of out-folding is also possible. For example, the electronic device 700 may be folded in the opposite direction compared to the in-folding case. Further, in still another embodiment, the electronic device 700 may be folded inwardly or outwardly with respect to the third axis 880 of the x-axis direction.

Figure 5:
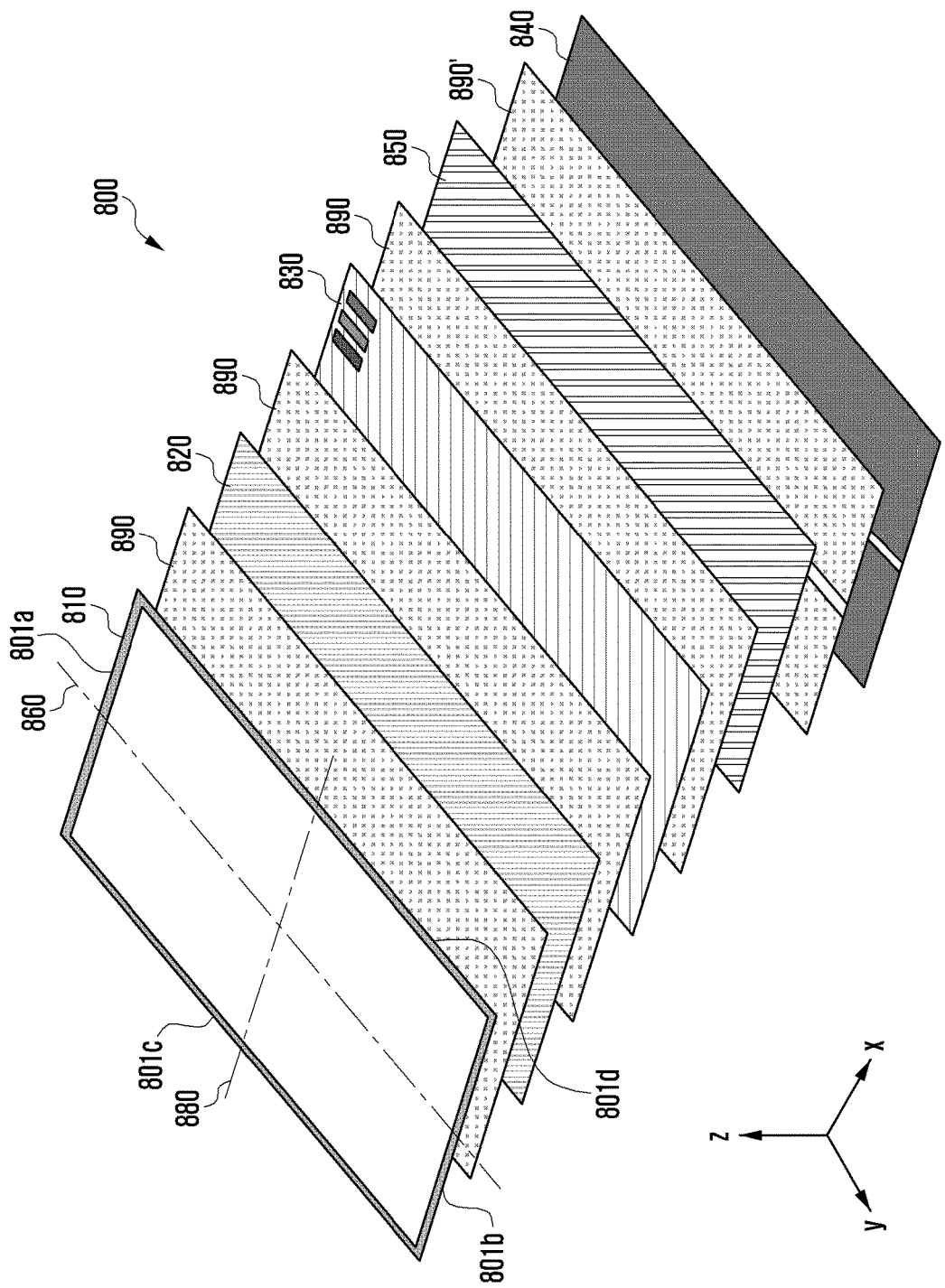
FIG. 5 is an exploded perspective view illustrating an example flexible display according to an embodiment.

FIG. 5 is an exploded perspective view illustrating an example flexible display 800 according to an embodiment.

The flexible display 800 according to an embodiment may include a window layer 810, a polarizing plate layer 820, and/or a display panel 830. In an embodiment, the flexible display 800 may be supported by a plate layer 840 and thereby maintain a flat shape.

In an embodiment, the window layer 810 may be exposed, at one surface thereof, to the outside of the electronic device 700 to receive a user's touch for a screen manipulation and an input operation. The window layer 810 may include a component corresponding to the size of the recess 730 of the first and second housings 710 and 720. When the electronic device 700 is folded or unfolded, the window layer 810 should be folded or unfolded together. Thus, the window layer 810 may made of a material that is elastically deformable. For example, the window layer 810 may comprise a polyimide material which is one of a plastic polymer series.

In an embodiment, the window layer 810 may be folded along the first axis 860 together with the folding of the first and second housings 710 and 720. The first axis 860 may cross the window layer 810 lengthwise. The first axis 860 may cross first and second opposite edges 801*a* and 801*b* of the flexible display 800 which is substantially rectangular in shape.

In an embodiment, one surface of the polarizing plate layer 820 may be combined with the other surface of the window layer 810, and the polarizing plate layer 820 may be folded together with the window layer 810. The polarizing plate layer 820 may prevent and/or reduce light generated by the display panel 830 from being reflected irregularly or being diffused in unintended directions. The polarizer plate layer 820 may be combined with the window layer 810 through an adhesive member 890. The polarizing plate layer 820 and the window layer 810 may be combined with each other so as to coincide with each other at positions corresponding to the first and second edges 801*a* and 801*b* in the unfolded state. That is, the polarizing plate layer 820 and the window layer 810 may have the substantially same length in a direction parallel to the first axis 860 and be aligned to coincide with each other at both edges crossing the first axis 860.

In an embodiment, one surface of the display panel 830 may be combined with the other surface of the polarizing plate layer 820, and the display panel 830 may be folded together with the window layer 810 and the polarizing plate layer 820. The display panel 830 may emit light under the control of a display driver IC, when power is supplied, and thereby display various kinds of information.

Figure 6:
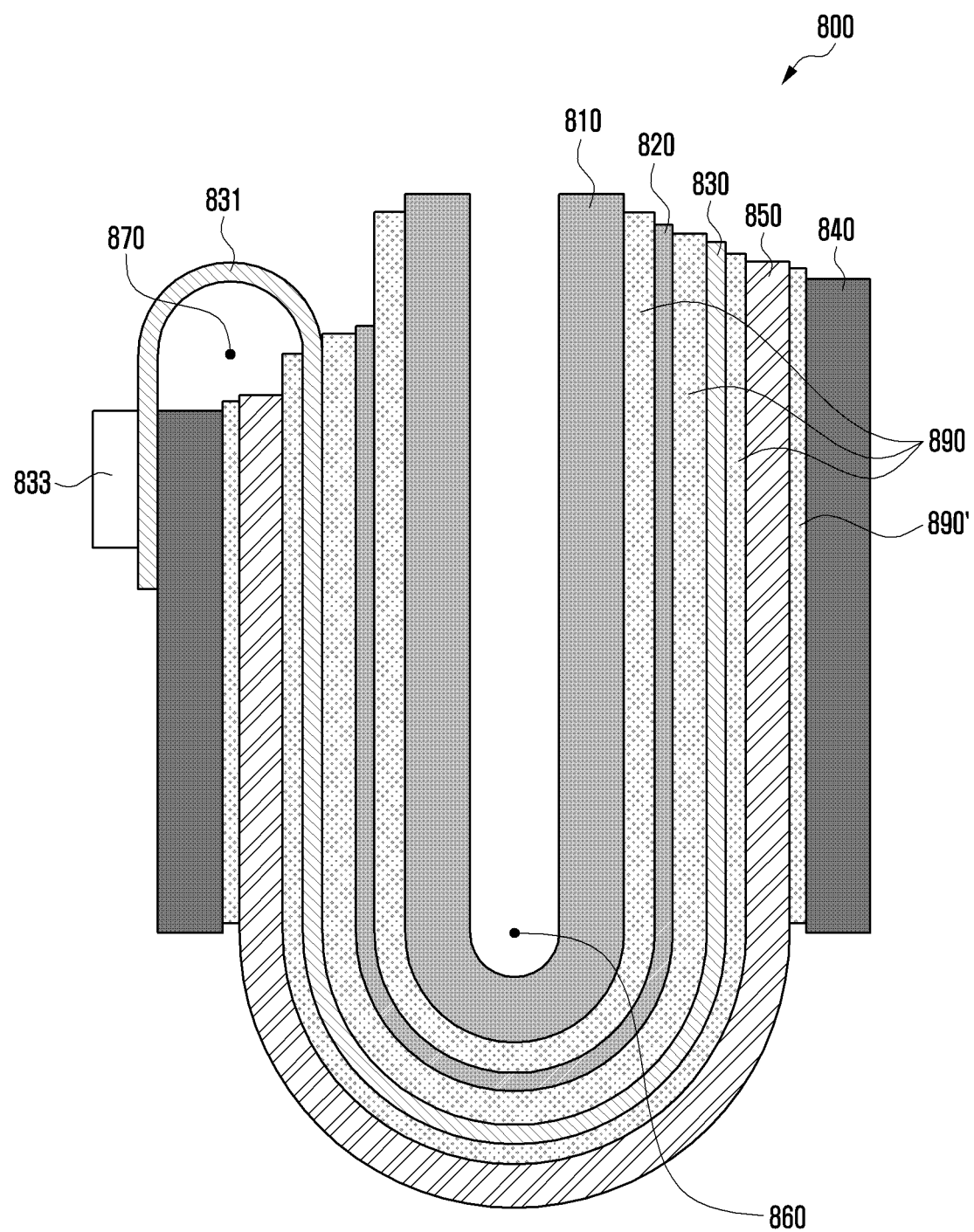
FIG. 6 is a cross-sectional view illustrating an example flexible display in a folded state according to an embodiment.

Referring to FIGS. 5 and 6, the display panel 830 according to an embodiment may include a bent portion 831 extending from the third edge 801*c* or the fourth edge 801*d* in the direction of the third axis 880 to be greater than the polarizing plate layer 820. The display driver IC 833 for controlling the display panel 830 may be disposed on the bent portion 831, and also a plurality of conductive lines for supplying signals to the display panel 830 may be disposed on the bent portion 831. The bent portion 831 may be formed to be adjacent to and extended from the third edge 801*c* or the fourth edge 801*d* that intersects the third axis 880. The display panel 830 may receive signals through the display driver IC 833 and the conductive lines formed on the bent portion 831. The display panel 830 may be combined with the polarizing plate layer 820 through another adhesive member 890.

In an embodiment, the display panel 830 and the polarizing plate layer 820 may be combined with each other so as to coincide with each other at positions corresponding to the first and second edges 801*a* and 801*b* in the unfolded state. That is, the display panel 830 and the polarizing plate layer 820 may have the substantially same length in a direction parallel to the first axis 860 and be aligned to coincide with each other at both edges crossing the first axis 860.

In an embodiment, the bent portion 831 may be further bent toward the other surface of the display panel 830 such that the amount of protrusion from the edge of the display panel 830 is minimized and/or reduced in the direction of the third axis 880. This bending is made with respect to the second axis 870 providing the center of curvature. The second axis 870 is parallel to the first axis 860 and adjacent to one of edges of the display panel 830.

In an embodiment, one surface of the plate layer 840 may be combined with the other surface of the display panel 830. The plate layer 840 may be divided along the first axis 860 at a position corresponding to the first axis 860. The plate layer 840 may comprise a material, such as a metal, which is capable of ensuring strength of a certain level or more and is shaped as a thin layer. For example, a metallic material such as, for example, and without limitation, stainless steel may be used.

In an embodiment, the plate layer 840 may provide a basic skeleton such that the display panel 830, the polarizing plate layer 820, and the window layer 810 may maintain a planar shape usually even though being formed to be easily deformed. The other surface of the plate layer 840 may be placed in and combined with the recess 730, so that the flexible display 800 is combined with the electronic device 700. One surface of the plate layer 840 may be combined with the display panel 830 through another adhesive member 890.

In another embodiment, a cushion layer 850 may be disposed between the other surface of the display panel 830 and one surface of the plate layer 840 and combined with them through another adhesive member 890' as shown. The cushion layer 850 may perform a function of ensuring a minimum radius of curvature of the above-described bent portion 831 such that the bent portion 831 maintains a bending state without breakage when bent about the second axis 870.

In this embodiment, the adhesive member 890' for combining the plate layer 840 and the cushion layer 850 may be divided to correspond to the divided plate layer 840. A separation distance between divided parts of the adhesive member 890' may be greater than that in the divided plate layer 840.

FIG. 6 is a cross-sectional view illustrating an example flexible display 800 in a folded state according to an embodiment.

In an embodiment, the flexible display 800 may be formed of the window layer 810, the polarizing plate layer 820, the display panel 830, the cushion layer 850, and the plate layer 840 which are sequentially stacked through the adhesive members 890 and 890'. When the flexible display 800 is folded about the first axis 860, a slip may occur between adjacent layers because each of the respective layers of the flexible display 800 has a certain thickness and the entire thickness of the stacked layers is increased.

Each layer of the flexible display 800 is not configured to slip freely. Because such a slip occurs in a state where adjacent layers are combined with each other through the bonding member 890, this may cause a shear stress between layers.

The shear stress may generally occur in a direction perpendicular to the first axis 860, this is, in the direction of the third axis 880. Under the condition that adhesion between layers is uniform, the shear stress may occur uniformly at any places between layers. This shear stress may affect each layer itself of the flexible display 800 as a compressive stress or a tensile stress in the direction of the third axis 880. Because the properties of materials themselves forming the respective layers of the flexible display 800 are stronger than the shear stress occurring in the direction of the third axis 880, the shear stress may not cause deformation in shape and thus the behavior of shear stress may not be visible.

However, if there is any portion not adhered between layers, the shear stress suddenly changes at that portion. For example, such a non-adhered portion acts as a boundary of a sudden change in shear stress. This change converts the direction of shear stress having occurred uniformly in the direction of the third axis 880 to an arbitrary direction, which may appear as a deformation around the non-adhered portion (e.g., the generation of waves on a surface).

For example, in case where the window layer 810 is formed wider than the polarizing plate layer 820, a non-adhered portion may occur when the window layer 810 and the polarizing plate layer 820 are adhered. In this state, when the flexible display 800 is folded about the first axis 860, a sudden change in shear stress may occur around the non-adhered portion between the window layer 810 and the polarizing plate layer 820. For example, for the first edge 801a and the second edge 801b crossed by the first axis 860, a sudden change in shear stress may cause a deformation of the window layer 810 (e.g., the generation of waves on a surface). That is, because the direction of shear stress coincides with the direction of a boundary of a sudden change in shear stress, such a change in shear stress is generated in a wide area along the first and second edges 801a and 801b of the window layer 810. This may cause a noticeable deformation in shape of the surface. Although this phenomenon is described regarding the window layer 810 and the polarizing plate layer 820, the same or similar phenomenon may also occur between the polarizing plate layer 820 and the display panel 830.

In an embodiment, the flexible display 800 may be formed such that the window layer 810, the polarizing plate layer 820, the display panel 830, and the cushion layer 850 have edges coinciding with each other at both ends of the flexible display 800 where the first and second edges 801a and 801b crossed by the first axis 860 are positioned. For example, the window layer 810, the polarizing plate layer 820, the display panel 830, and the cushion layer 850 may be formed to have the substantially same length in the direction of the first axis 860 such that a certain portion that is likely to cause a surface deformation can be removed.

Figure 7A:
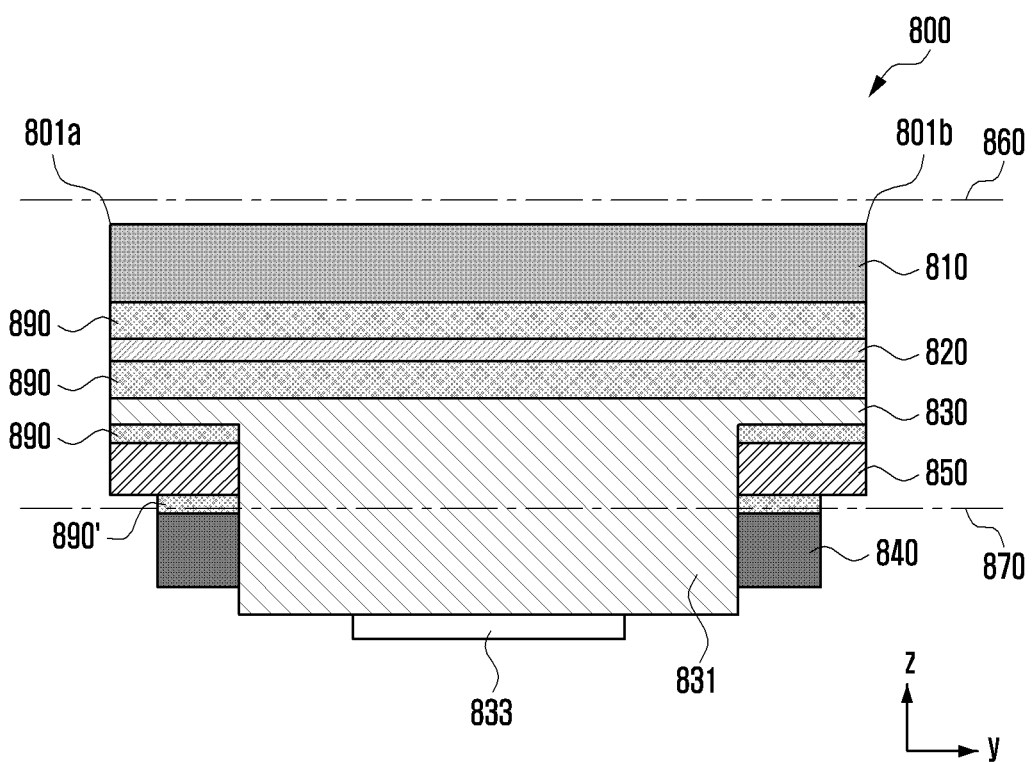
FIG. 7A is a cross-sectional view illustrating an example flexible display when viewed in the x-axis direction, according to an embodiment.
Figure 7B:
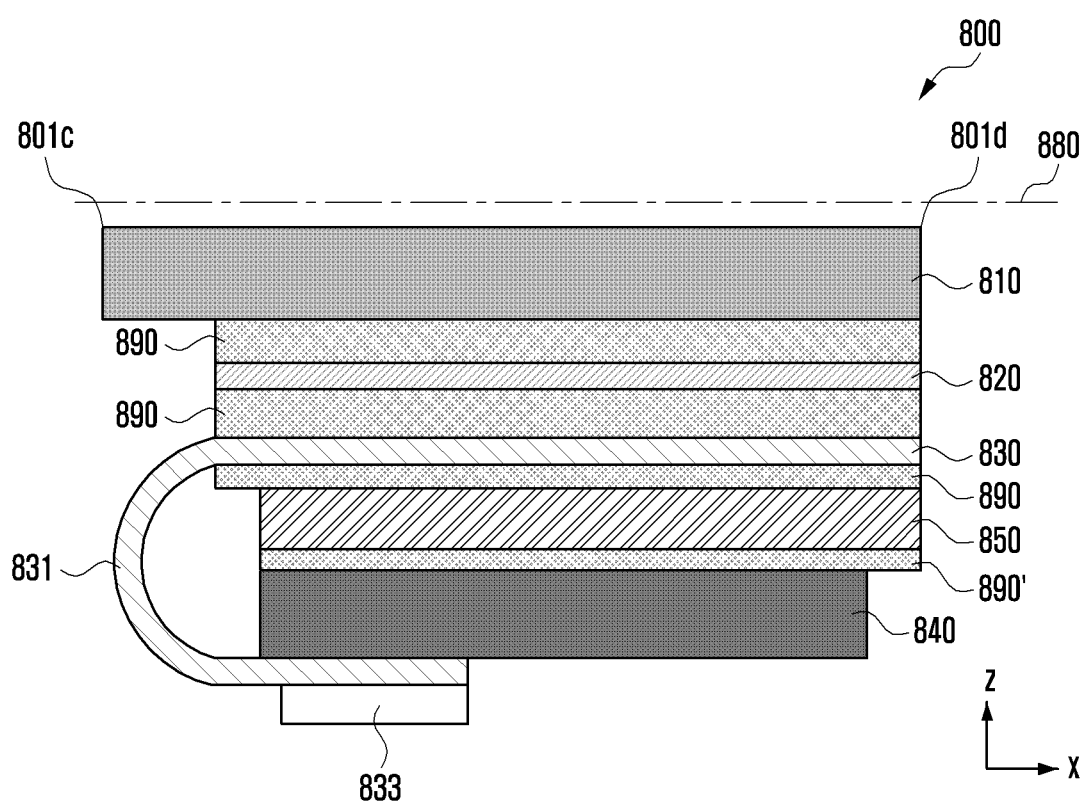
FIG. 7B is a cross-sectional view illustrating an example flexible display when viewed in the y-axis direction according to an embodiment.

FIG. 7A is a cross-sectional view illustrating an example flexible display 800 according to an embodiment when viewed in the x-axis direction, and FIG. 7B is a cross-sectional view when viewed in the y-axis direction.

Referring to FIG. 7A, the window layer 810, the polarizing plate layer 820, the display panel 830, and the cushion layer 850 are formed to have the substantially same length in the direction of the first axis 860. Therefore, a non-adhered portion is not produced, so that any deformation that can occur on the window layer 810 (e.g., the generation of waves on a surface) may be prevented.

Referring to FIG. 7B, in case of one end of the flexible display 800 where the third edge 801c of the window layer 810 and the bent portion 831 are positioned, the third edge 801c of the window layer 810 may not coincide with corresponding edges of other layers (e.g., the polarizing plate layer 820, the display panel 830, and the cushion layer 850). In an embodiment, due to the presence of the display driver IC 833 and the bent portion 831, all the edges of layers of the flexible display 800 may not perfectly coincide with each other, but a mismatch may be minimized and/or reduced.

In case of other end of the flexible display 800 where the fourth edge 801d is positioned, all the edges of the window layer 810, the polarizing plate layer 820, the display panel 830, and the cushion layer 850 may coincide with each other. Therefore, at this position, a non-adhered portion may not occur between layers of the flexible display 800.

As such, when there is a non-adhered portion between layers with respect to the direction of the third axis 880, a sudden change in shear stress may occur around the non-adhered portion. For example, the non-adhered portion may occur at the left end shown in FIG. 7B, and then a sudden change in shear stress may be caused around the non-adhered portion.

However, unlike the case of the first and second edges 801a and 801b crossed by the first axis 860, in case of the third and fourth edges 801c and 801d crossed by the third axis 880, the direction of these parallel edges is perpendicular to the direction of shear stress generated when the flexible display 800 is folded. Therefore, the non-adhered portion generated in the direction of shear stress is formed very narrowly, so that relatively few deformation of the window layer 810 may appear. That is, even if the non-adhered portion occurs in part at the left end shown in FIG. 7B, the window layer 810 may not be deformed.

Figure 8:
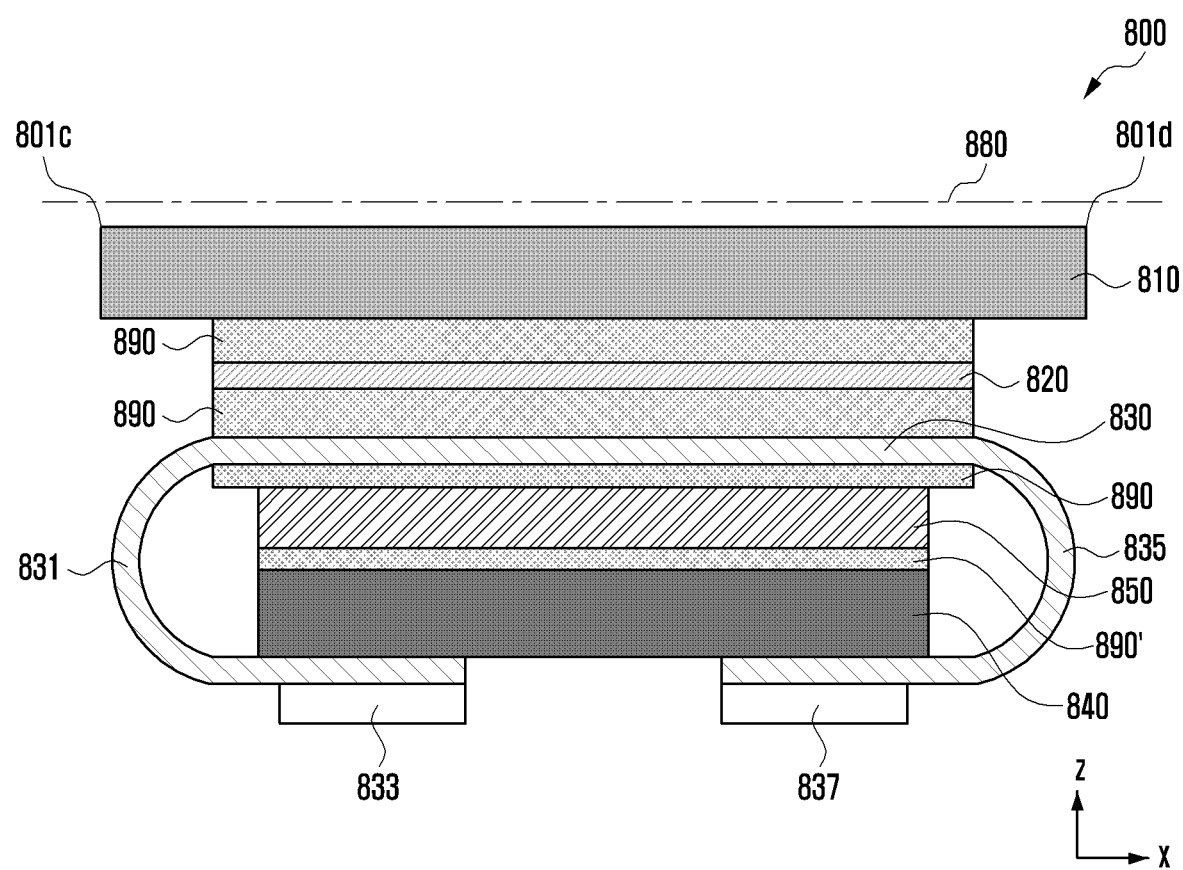
FIG. 8 is a cross-sectional view illustrating an example flexible display when viewed in the y-axis direction according to another embodiment.

FIG. 8 is a cross-sectional view illustrating an example flexible display 830 according to another embodiment when viewed in the y-axis direction.

As compared with FIG. 7B in which there are only one display driver IC 833 and only one bent portion 831, FIG. 8 shows two display driver ICs 833 and 837 and two bent portions 831 and 835. In this example, the presence of both ICs and both bent portions can reduce the edge mismatch of layers forming the flexible display 800. As a result, any deformation that can occur on the window layer 810 (e.g., the generation of waves on a surface) may be reduced.

Figure 9:
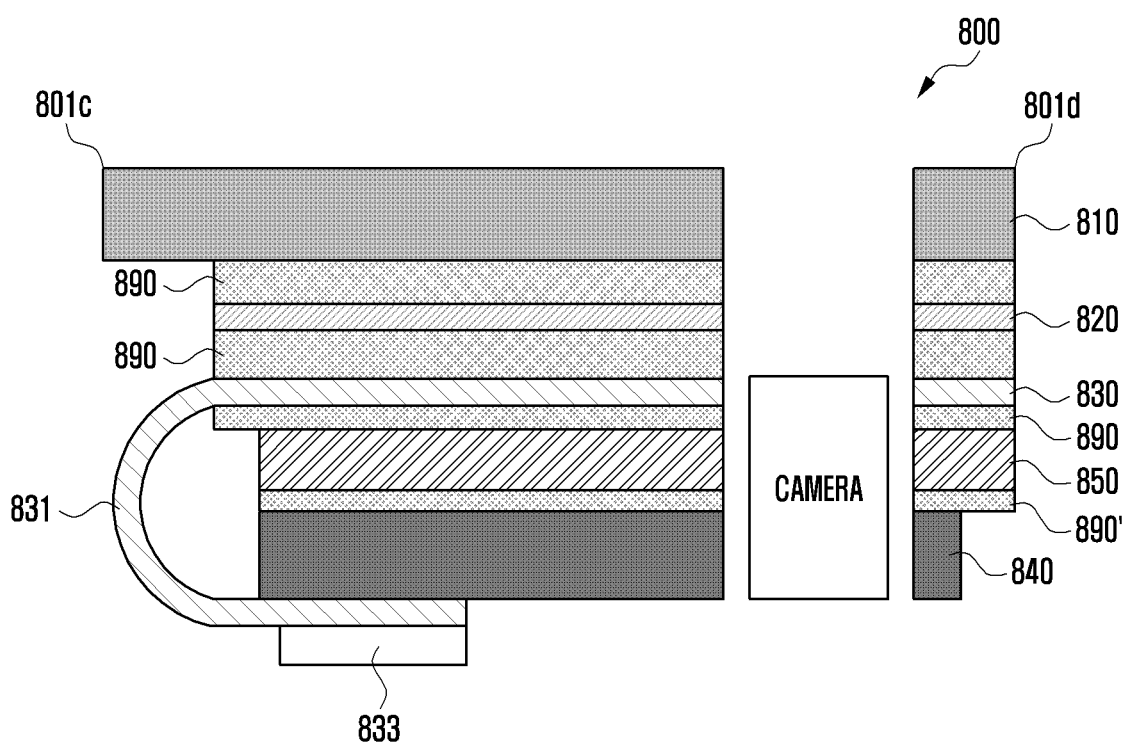
FIG. 9 is a cross-sectional view illustrating an example flexible display having a hole formed in an active area according to an embodiment.

FIG. 9 is a cross-sectional view illustrating an example flexible display 800 having a hole formed in an active area according to an embodiment. The active area may refer, for example, to a screen displaying portion in the display panel 830.

In case of the window layer 810 of the electronic device 700 according to an embodiment, a position where a sensor and/or a camera module are disposed may not allow attaching the polarizing plate layer 820, the display panel 830, and/or the cushion layer 850 to the other surface of the window layer 810. This may result in a non-adhered portion to the window layer 810 and thereby cause the deformation of the window layer 810 when the flexible display 800 is folded. Therefore, in order to prevent and/or reduce the occurrence of such a non-adhered portion, a portion of the window layer 810 corresponding to the sensor and/or the camera module may be removed to form a hole as shown. Further, this hole of the window layer 810 may be covered with a transparent protective film to prevent and/or reduce foreign matters from entering through the hole and to prevent and/or reduce the sensor and/or the camera module from being directly exposed.

Figure 10:
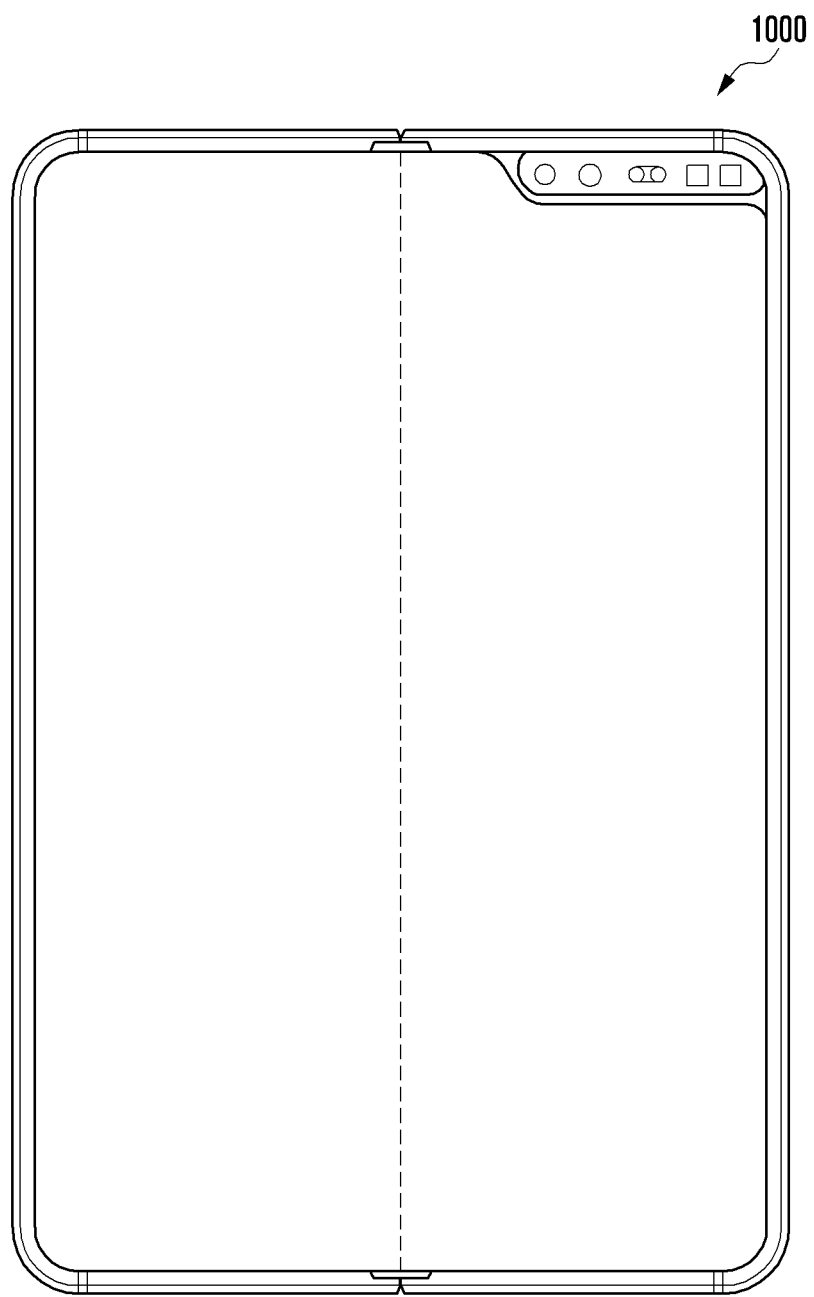
FIGS. 10 and 11 are diagrams illustrating an example flexible display according to various embodiments.
Figure 11:
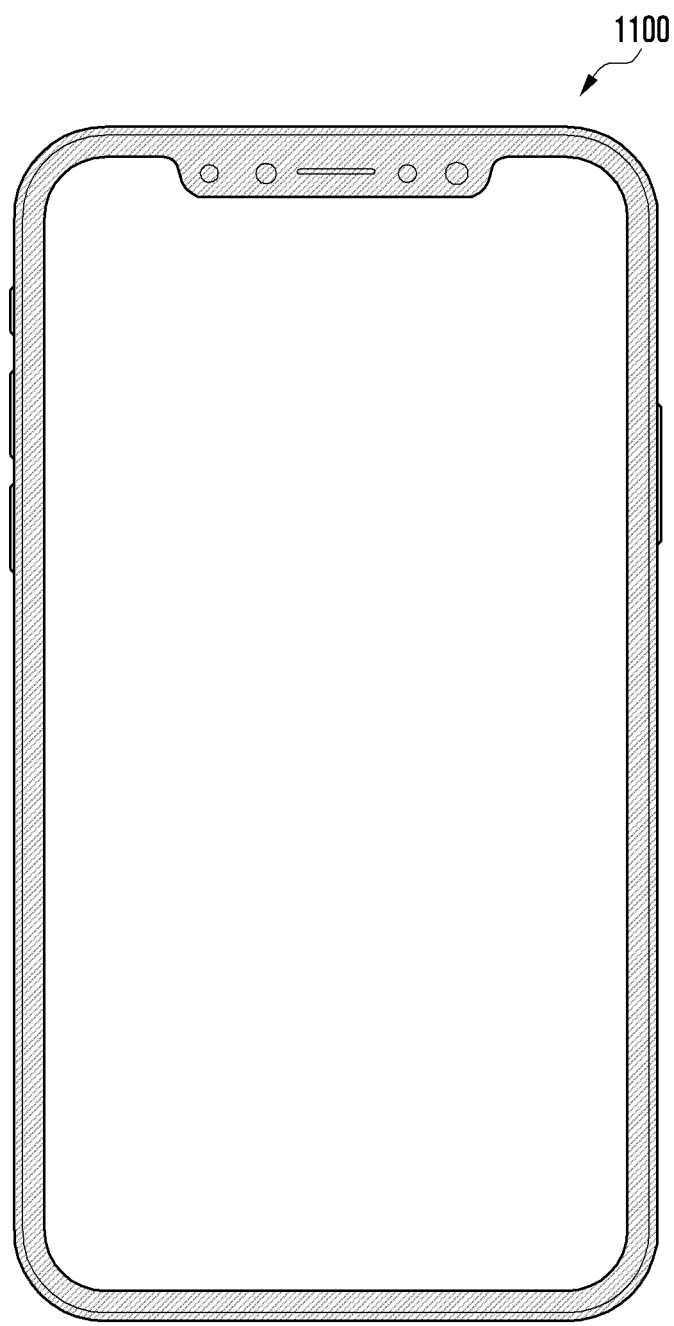

FIGS. 10 and 11 are diagrams illustrating an example flexible display according to various embodiments. For example, FIG. 10 illustrates a flexible display 1000 having an L-cut partially formed in the active area, and FIG. 11 illustrates a flexible display 1100 having a notch-cut partially formed in the active area.

As in case of FIG. 9, a non-adhered portion may occur in a window layer (e.g., 810 in FIG. 5) of the flexible display 1000 or 1100 shown in FIG. 10 or 11 due to the L-cut or notch-cut, so that the window layer 810 may be deformed when the flexible display 1000 or 1100 is folded. Thus, in order to prevent and/or reduce the occurrence of the non-adhered portion, a corresponding portion of the window layer 810 may be removed. Further, this removed portion of the window layer 810 may be covered with a transparent protective film to prevent and/or reduce the inflow of foreign matters and to prevent and/or reduce components disposed in the L-cut or notch-cut from being directly exposed.

As described above, according to various example embodiments of the disclosure, it is possible to prevent and/or reduce irregular deformation of the window layer in a bending or folding operation of the flexible display. As used herein, the term "combined" when referencing, for example, various layers, surfaces and structures of the flexible electronic device is not limited to being directly combined, and may include various intervening layers, structures, materials, or the like as well as being directly combined.

For example, various layers of the flexible display have the same size in the direction of the central axis of the bending or folding operation, so that the shear stress distribution can be uniform over the entire window layer. This may prevent and/or reduce wave phenomenon that may appear on the surface of the window layer.

According to an embodiment of the disclosure, as shown in FIG. 4A for example, an electronic device may include a foldable housing and a flexible display. The foldable housing may include a first housing, a second housing foldably connected to the first housing, and a recess included in both the first and second housings st. The first and second housings are foldable about a first axis extending in a first direction, face each other in a folded state, and together define a plane in an unfolded state. The flexible display is disposed in the recess and includes a first area corresponding to the first housing and a second area corresponding to the second housing. The flexible display 800 includes a plurality of layers, at least one of which includes a flat portion and a bent portion extending from an edge of the flat portion. The bent portion may be bent about a second axis parallel to the first axis.

The first housing may further include a first lateral member forming a part of the recess and having a first portion extending in parallel to the first axis, and the bent portion extends along the first portion of the first lateral member when the flexible display 800 is viewed from above.

The bent portion may include a plurality of conductive lines formed thereon.

The electronic device may further include a display driver circuit electrically connected to the plurality of conductive lines and mounted on the bent portion.

The flexible display may further include an external layer forming an outer surface of the flexible display and disposed to be adjacent to the first lateral member.

The external layer may include a first side extending in the first direction along the first portion of the first lateral member, a second side extending from the first side in a second direction perpendicular to the first direction, a third side extending in the first direction to be parallel to the first side, and a fourth side extending in the second direction to be parallel to the second side. One or more of the plurality of layers may have no bent portion and extend to the second, third, and fourth sides when the external layer is viewed from above.

The one or more of the plurality of layers may include a first adhesive layer attached to the external layer.

The one or more of the plurality of layers may further include a polarizing plate layer, and the first adhesive layer may be disposed between the external layer and the polarizing plate layer.

According to an embodiment of the disclosure, a flexible display may include a window layer configured to be subjected to a bending deformation, a first axis parallel to a surface of the window layer, crossing the window layer, and being a center line of the bending deformation of the window layer, a polarizing plate layer having one surface combined with another surface of the window layer wherein edges thereof coincide with corresponding edges of the window layer with respect to a direction of the first axis, a display panel having one surface combined with another surface of the polarizing plate layer wherein edges of the display panel coincide with corresponding edges of the polarizing plate layer with respect to the direction of the first axis, and a plate layer having one surface combined with other surface of the display panel.

The first axis may pass through a center of the window layer.

The flexible display may further include a third axis parallel to the surface of the window layer, crossing the window layer, and perpendicular to the first axis. With respect to a direction of the third axis, the polarizing plate layer may have one edge coinciding with a corresponding one edge of the window layer and another edge not coinciding with a corresponding another edge of the window layer.

With respect to the direction of the third axis, the display panel may have one edge coinciding with a corresponding one edge of the polarizing plate layer and another edge not coinciding with corresponding another edge of the polarizing plate layer.

The display panel may, at the other edge thereof, be longer than the polarizing plate layer and curved to another surface of the plate layer.

The plate layer may be divided along the first axis at a position corresponding the first axis.

The flexible display may further include a cushion layer disposed between the display panel and the plate layer.

With respect to the direction of the first axis, the window layer, the polarizing plate layer, the display panel, and the cushion layer may coincide with each other at edges thereof.

With respect to the direction of the third axis, the window layer, the polarizing plate layer, and the display panel may coincide with each other at one edges thereof and do not coincide with each other at other edges thereof.

According to an embodiment of the disclosure, an electronic device may include a first housing, a second housing foldably connected to the first housing, a recess provided in both the first and second housings from one surface of the electronic device towards another surface, and a flexible display disposed in the recess. The flexible display may include a window layer having one exposed surface and folded together with the first and second housings, a first axis parallel to the surface of the window layer, crossing the window layer, and being a center line of the bending deformation of the window layer, a polarizing plate layer having one surface combined with another surface of the window layer wherein edges of the polarizing plate layer coincide with corresponding edges and of the window layer with respect to a direction of the first axis, a display panel having one surface combined with another surface of the polarizing plate layer wherein edges of the display panel coincide with corresponding edges of the polarizing plate layer with respect to the direction of the first axis, and a plate layer having one surface combined with another surface of the display panel.

The first axis may correspond to a connecting position between the first housing and the second housing.

The electronic device may further include a third axis parallel to the surface of the window layer, crossing the window layer, and perpendicular to the first axis. With respect to a direction of the third axis, the polarizing plate layer may have one edge coinciding with a corresponding one edge of the window layer and another edge not coinciding with a corresponding other edge of the window layer.

The plate layer may be divided along the first axis at a position corresponding the first axis.

The flexible display may further include a cushion layer disposed between the display panel and the plate layer.

With respect to the direction of the first axis, the window layer, the polarizing plate layer, the display panel, and the cushion layer may coincide with each other at positions of edges and thereof.

While the disclosure has been illustrated and described with reference to various example embodiments thereof, it will be understood by those skilled in the art that various changes in form and details may be made therein without departing from the scope of the subject matter as may be defined, for example, by the appended claims.

What is claimed is:

1. An electronic device comprising:
   a foldable housing; and
   a flexible display,
   wherein the foldable housing includes:
   a first housing;
   a second housing foldably connected to the first housing; and
   a recess provided in both the first housing and the second housing,
   wherein the first housing and the second housing are foldable about a first axis extending in a first direction, face each other in a folded state, and together define a plane in an unfolded state,
   wherein the flexible display is disposed in the recess and includes a first area corresponding to the first housing and a second area corresponding to the second housing,
   wherein the flexible display includes a plurality of layers, at least one of which includes a flat portion and a bent portion extending from an edge of the flat portion,
   wherein the bent portion is bent about a second axis parallel to the first axis, and
   wherein the plurality of layers includes a window layer capable of being subjected to a bending deformation, a polarizing plate layer having one surface combined with a surface of the window layer and a display panel having one surface combined with another surface of the polarizing plate layer, and the window layer, the polarizing plate layer and the display panel have a same length with respect to a direction of the first axis.

2. The electronic device of claim 1, wherein the first housing further includes a first lateral member forming a part of the recess and having a first portion extending parallel to the first axis, and
   wherein the bent portion extends along the first portion of the first lateral member when the flexible display is viewed from above.

3. The electronic device of claim 2, wherein a plurality of conductive lines are disposed on the bent portion.

4. The electronic device of claim 3, further comprising:
   a display driver circuit electrically connected to the plurality of conductive lines and mounted on the bent portion.

5. The electronic device of claim 2, wherein the window layer defines an outer surface of the flexible display and disposed to be adjacent to the first lateral member.

6. The electronic device of claim 5, wherein the window layer includes:
   a first side extending in the first direction along the first portion of the first lateral member;
   a second side extending from the first side in a second direction perpendicular to the first direction;
   a third side extending in the first direction parallel to the first side; and
   a fourth side extending in the second direction parallel to the second side, and
   wherein one or more of the plurality of layers have no bent portion and extend to the second, third, and fourth sides when the window layer is viewed from above.

7. The electronic device of claim 6, wherein the one or more of the plurality of layers include a first adhesive layer attached to the window layer.

8. The electronic device of claim 7, wherein
   the first adhesive layer is disposed between the window layer and the polarizing plate layer.

9. A flexible display comprising:
   a window layer capable of being subjected to a bending deformation;
   a first axis parallel to a surface of the window layer, crossing the window layer, and being a center line of the bending deformation of the window layer;
   a polarizing plate layer having one surface combined with another surface of the window layer wherein the polarizing plate layer and the window layer have a same length with respect to a direction of the first axis and edges on opposite ends of the polarizing plate layer coincide with corresponding edges on opposite ends of the window layer with respect to the direction of the first axis;
   a display panel having one surface combined with another surface of the polarizing plate layer wherein the display panel and the polarizing plate layer have a same length with respect to the direction of the first axis and edges on opposite ends of the display panel coincide with corresponding edges on the opposite ends of the polarizing plate layer with respect to the direction of the first axis; and
   a plate layer having one surface combined with another surface of the display panel.

10. The flexible display of claim 9, wherein the first axis passes through a center of the window layer.

11. The flexible display of claim 9, further comprising:
    a third axis parallel to the surface of the window layer, crossing the window layer, and perpendicular to the first axis,
    wherein with respect to a direction of the third axis, the polarizing plate layer has one edge coinciding with corresponding one edge of the window layer and another edge not coinciding with a corresponding another edge of the window layer.

12. The flexible display of claim 11, wherein with respect to the direction of the third axis, the display panel has one edge coinciding with a corresponding one edge of the polarizing plate layer and another edge not coinciding with a corresponding another edge of the polarizing plate layer.

13. The flexible display of claim 12, wherein the display panel is, at the other edge thereof, longer than the polarizing plate layer and is curved to another surface of the plate layer.

14. The flexible display of claim 9, wherein the plate layer is divided along the first axis at a position corresponding the first axis.

15. The flexible display of claim 9, further comprising:
a cushion layer disposed between the display panel and the plate layer.

16. The flexible display of claim 15, wherein with respect to the direction of the first axis, the window layer, the polarizing plate layer, the display panel, and the cushion layer coincide with each other at edges thereof.

17. The flexible display of claim 11, wherein with respect to the direction of the third axis, the window layer, the polarizing plate layer, and the display panel coincide with each other at one edges thereof and do not coincide with each other at other edges thereof.

18. An electronic device comprising:
a first housing;
a second housing foldably connected to the first housing;
a recess provided in both the first housing and the second housing from one surface of the electronic device towards another surface; and
a flexible display disposed in the recess,
wherein the flexible display includes:
a window layer having one exposed surface and configured to be folded together with the first housing and the second housing;
a first axis parallel to the surface of the window layer, crossing the window layer, and being a center line of a bending deformation of the window layer;
a polarizing plate layer having one surface combined with another surface of the window layer wherein the polarizing plate layer and the window layer have a same length with respect to a direction of the first axis and edges on opposite ends of the polarizing plate layer coincide with corresponding edges on opposite ends of the window layer with respect to the direction of the first axis;
a display panel having one surface combined with another surface of the polarizing plate layer wherein the display panel and the polarizing plate layer have a same length with respect to the direction of the first axis and edges on opposite ends of the display panel coincide with corresponding edges on the opposite ends of the polarizing plate layer with respect to the direction of the first axis; and
a plate layer having one surface combined with another surface of the display panel.

19. The electronic device of claim 18, wherein the first axis corresponds to a connecting position between the first housing and the second housing.

20. The electronic device of claim 18, further comprising:
a third axis parallel to the surface of the window layer, crossing the window layer, and perpendicular to the first axis,
wherein with respect to a direction of the third axis, the polarizing plate layer has one edge coinciding with a corresponding one edge of the window layer and another edge not coinciding with a corresponding other edge of the window layer.

\* \* \* \* \*